United States Patent [19]
Sawamura et al.

[11] Patent Number: 6,020,612
[45] Date of Patent: Feb. 1, 2000

[54] SEMICONDUCTOR INTEGRATED CIRCUIT HAVING EFFICIENT LAYOUT OF WIRING LINES

[75] Inventors: Takahiro Sawamura; Toshiya Uchida; Hiromi Kanda, all of Kawasaki, Japan

[73] Assignee: Fujitsu Limited, Kawasaki, Japan

[21] Appl. No.: 08/970,563

[22] Filed: Nov. 14, 1997

[30] Foreign Application Priority Data

May 30, 1997 [JP] Japan .................................. 9-142307

[51] Int. Cl.7 .......................... H01L 29/76; H01L 31/113
[52] U.S. Cl. ........................ 257/341; 257/382; 257/401; 257/758; 257/920
[58] Field of Search .................................. 257/368, 382, 257/700, 758, 773, 774, 341, 207, 401, 920

[56] References Cited

U.S. PATENT DOCUMENTS

| | | | |
|---|---|---|---|
| 5,554,867 | 9/1996 | Ajika et al. .............................. | 257/314 |
| 5,864,155 | 1/1999 | Melzner ................................... | 257/306 |
| 5,866,933 | 2/1999 | Baukus et al. ........................... | 257/368 |
| 5,874,764 | 2/1999 | Hsieh et al. ............................. | 257/401 |

*Primary Examiner*—Mahshid Saadat
*Assistant Examiner*—George C. Eckert, II
*Attorney, Agent, or Firm*—Armstrong, Westerman, Hattori, McLeland & Naughton

[57] ABSTRACT

A semiconductor integrated circuit includes a gate extending in a first direction, a diffusion-layer region corresponding to the gate, and a plurality of backing wiring lines connected to the diffusion-layer region and extending in a first wiring layer in a second direction substantially perpendicular to the first direction. The semiconductor integrated circuit further includes connection wiring lines providing connections between the plurality of backing wiring lines and provided in a second wiring layer.

10 Claims, 9 Drawing Sheets

6,020,612

SEMICONDUCTOR INTEGRATED CIRCUIT HAVING EFFICIENT LAYOUT OF WIRING LINES

BACKGROUND OF THE INVENTION

1. Field of the Invention

The present invention generally relates to semiconductor integrated circuits, and particularly relates to wiring of device elements in semiconductor integrated circuits.

2. Description of the Related Art

Semiconductor devices such as semiconductor memories need to meet a demand for a greater circuit density in order to achieve a higher capacity, a higher operation speed, etc. In order to increase circuit density and reduce chip size, each of the circuit elements need to be arranged to make efficient use of available space, and wiring lines between circuit elements should be laid out as short as possible so as to avoid excessive resistance and capacitance.

In circuits used in semiconductor memories, for example, metal wiring lines having a high conductivity are laid out over source-and-drain regions of a semiconductor device in parallel to a gate thereof, and contacts are provided at a plurality of points between the metal wiring lines and a diffusion layer of the semiconductor device. This layout is called a "backing". The backing makes it possible to implement a sufficiently large gate width despite a relatively large resistance of the diffusion layer.

FIGS. 1A and 1B are illustrative drawings showing a backing of source-and-drain regions through metal wiring lines.

In FIGS. 1A and 1B, diffusion-layer regions 202 and 203, which form a source region and a drain region, are provided on either side of a gate 201 made of a polysilicon. These N-type diffusion-layer regions (202 and 203) are formed near the surface of a P-type substrate 210. In a wiring layer above the substrate 210, metal wiring lines 204 and 205 are laid out over the diffusion-layer regions 202 and 203 in parallel to the gate 201. The metal wiring lines 204 and 205 are connected to the diffusion-layer regions 202 and 203, respectively, via a plurality of contacts 206 and 207. If only a respective one of the contacts 206 and 207 which are shown at the bottom of FIG. 1A was provided, no electric current would be observed in a portion near the top of FIG. 1A while a current would flow through the diffusion-layer regions in a proximity of the contacts. This is because the diffusion-layer regions 202 and 203 have a large resistance.

As shown in FIGS. 1A and 1B, backing of the diffusion-layer regions 202 and 203 by the metal wiring lines 204 and 205 and the contacts 206 and 207 ensures that an electric current flows between the diffusion-layer regions 202 and 203 throughout the extent of the diffusion-layer regions 202 and 203. In this manner, a sufficiently large and desirable gate width can be obtained.

FIG. 2 is an illustrative drawing showing an example of a layout in which a NAND circuit is implemented as a semiconductor device. FIG. 3 is a circuit diagram of the NAND circuit of FIG. 2. In FIG. 2 and FIG. 3, the same elements are referred to by the same numerals.

The NAND circuit of FIG. 3 includes PMOS transistors 221 and 222 and NMOS transistors 223 and 224. A result obtained by taking a NAND operation between an input In1 and an input In2 is provided at an output Out.

In FIG. 2, an Nwell 231 is formed in a P-type substrate, and a C-MOS transistor is created by using a P-type diffusion-layer region 232, an N-type diffusion-layer region 233, and polysilicon gates 234 through 3241. A correspondence between the polysilicon gates 234 through 241 and the transistors 221 through 224 is shown in FIG. 3 where the gates 234 through 241 are indicated.

The input In1 is connected to the gates 236 and 237 as well as to the gates 239 and 240. The input In2 is connected to the gates 234 and 235 and to the gates 238 and 241. A ground wiring line 252 is connected to wiring lines 253 which correspond to a source of the NMOS transistor 224. A power wiring line 250 is connected to wiring lines 251 which correspond to sources of the PMOS transistors 221 and 222. The output Out is connected to wiring lines 254 corresponding to drains of the PMOS transistors 221 and 222, and, also, is connected to a wiring line 255 which corresponds to a drain of the NMOS transistor 223.

In an example of FIG. 2, the wiring lines 251, 253, 254, and 255 are used for backings, and provided in a first wiring layer above the P-type substrate. On the other hand, the power wiring line 250, the ground wiring line 252, the input wiring line In1, and a traversing wiring line 400 are arranged in a second wiring layer provided over the first wiring layer.

In a related-art layout described above, the first wiring layer accommodates wiring lines which extend in a direction parallel to gates of devices, and the second wiring layer houses wiring lines which run in a direction perpendicular to the gates. Such a layout is employed because wiring lines crossing each other need to be arranged in different wiring layers. That is, since the metal wiring lines for the backings are provided to extend in parallel to the gates in the first layer, the wiring lines extending perpendicularly to the gates need to be arranged in the second wiring layer in order to implement a required layout.

FIG. 4 is an illustrative drawing showing wiring layers used in the related art. In FIG. 4, the same elements as those of FIG. 1 are referred to by the same numerals, and a description thereof will be omitted.

As shown in FIG. 4, the metal wiring lines 204 and 205 in the first wiring layer extend in a direction parallel to the extension of the gate 201, which is a direction perpendicular to the surface of the figure sheet. A wiring line 209, which is connected to the metal wiring line 205 via a contact 208, extends in a direction perpendicular to the gate 201 in the second wiring layer which is provided above the first wiring layer.

In the related-art layout shown in FIG. 2, the input wiring line In2 and the traversing wiring line 300 cannot be laid out over the circuit devices. This is because there is no space to accommodate other wiring lines in addition to the metal wiring lines 251, 253, 254, and 255 provided for the backing purpose when the metal wiring lines 251, 253, 254, and 255 are arranged close to each other. Because of this, the input wiring line In2 and the traversing wiring line 300 need to be arranged to bypass areas over the circuit devices as shown in FIG. 2, thereby placing a significant restriction on latitude in the layout of wiring lines. Further, such bypassing brings about increases in wiring resistance and capacitance which lead to a decrease in signal transmission speed. In this regard, a bypassed layout should be avoided as much as possible.

Accordingly, there is a need for a semiconductor integrated circuit in which a backing can be provided without placing a restriction on latitude in the layout of wiring lines.

SUMMARY OF THE INVENTION

Accordingly, it is a general object of the present invention to provide a semiconductor integrated circuit which can satisfy the need described above.

It is another and more specific object of the present invention to provide a semiconductor integrated circuit in which a backing can be provided without placing a restriction on latitude in the layout of wiring lines.

In order to achieve the above objects, a semiconductor integrated circuit according to the present invention includes a gate extending in a first direction, a diffusion-layer region corresponding to the gate, a plurality of backing wiring lines connected to the diffusion-layer region and extending in a first wiring layer in a second direction substantially perpendicular to the first direction, and connection wiring lines providing connections between the plurality of backing wiring lines and provided in a second wiring layer.

In the semiconductor integrated circuit described above, wiring lines extending in parallel to the gate in the second wiring layer can be laid out to run across an area over a circuit device. Further, when wiring lines extending perpendicularly to the gate are laid out, these wiring lines can be arranged to travel across the area over the circuit device by adjusting intervals between the plurality of backing wiring lines. Therefore, there is no need for traversing wiring lines or the like to bypass the circuit device, thereby allowing wiring lines to be laid out with greater latitude.

According to one aspect of the present invention, the plurality of backing wiring lines are connected to the diffusion-layer region via a plurality of contacts, thereby achieving a sufficiently broad and desirable gate width.

According to another aspect of the present invention, wiring lines in the first wiring layer are provided at a right angle with wiring lines in the second wiring layer, so that use of the first wiring layer and the second wiring layer helps to create an efficient layout.

According to another aspect of the present invention, wiring lines in either one of the first wiring layer and the second wiring layer can pass through the area over the circuit device without bypassing the area, so that it is possible to avoid creating an excessive amount of wiring-line resistance and capacitance, and an area size required for laying out wiring lines can be decreased by total widths of the wiring lines which pass through the area over the circuit device rather than bypassing the area.

According to another aspect of the present invention, when a second circuit device such as a transistor having a gate extending in the second direction is formed on the same substrate with the above-described circuit device having the gate extending in the first direction, backing wiring lines are provided in parallel to the gate of the second circuit device. This makes it possible to lay out wiring lines without undermining a basic layout principle that the wiring lines extending in the second direction are provided in the first wiring layer and the wiring lines running in the first direction are provided in the second wiring layer. All the wiring lines thus can be laid out in an efficient manner.

Other objects and further features of the present invention will be apparent from the following detailed description when read in conjunction with the accompanying drawings.

DESCRIPTION OF THE PREFERRED EMBODIMENTS

In the following, a principle and embodiments of the present invention will be described with reference to the accompanying drawings.

Figure 5A:
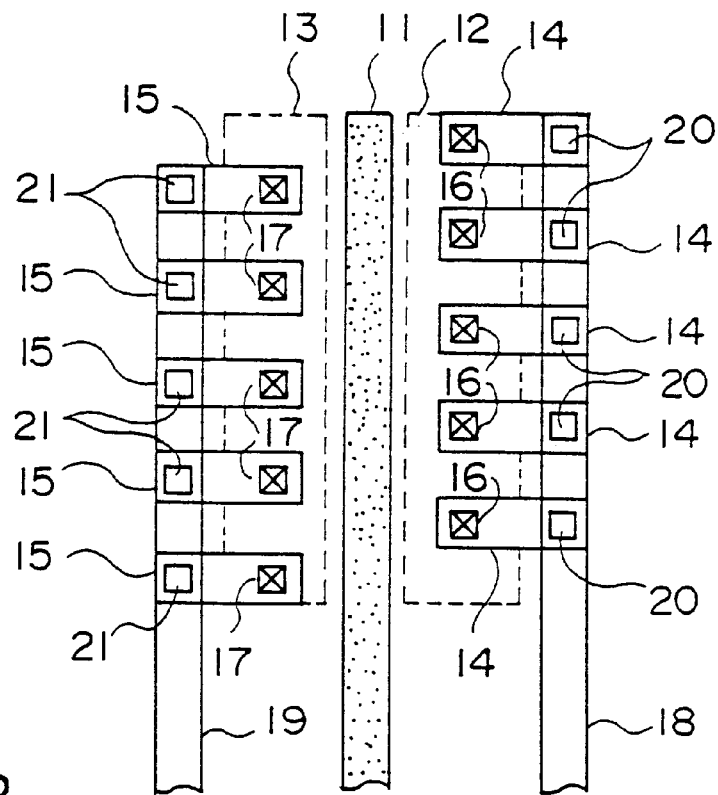
FIGS. 5A and 5B are illustrative drawings showing a backing layout for a semiconductor device according to the present invention.
Figure 5B:
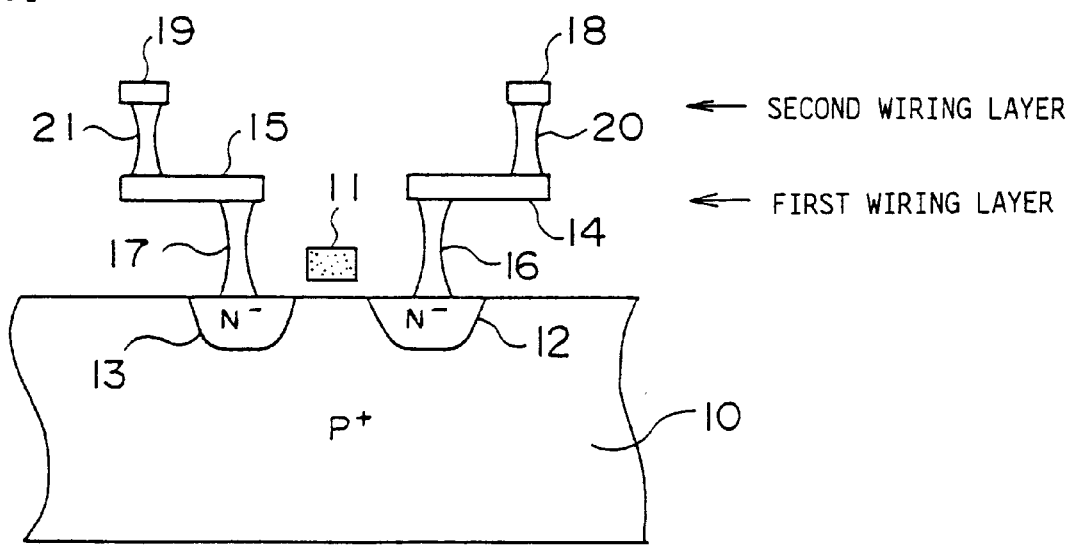

FIGS. 5A and 5B are illustrative drawings showing a backing layout for a semiconductor device according to the present invention.

As shown in FIG. 5A, diffusion-layer regions 12 and 13, which form a source region and a drain region, are provided on either side of a gate 11 made of a polysilicon. As shown in FIG. 5B, the diffusion-layer regions 12 and 13, which have an N-type conductivity, for example, are formed near the surface of a P-type substrate 10.

As shown in FIGS. 5A and 5B, backing-purpose metal wiring lines 14 and 15 are arranged in a direction perpendicular to the extension of the gate 11 in a first wiring layer provided above the substrate 10. One end of the backing-purpose metal wiring lines 14 and 15 is electrically connected to the diffusion-layer regions 12 and 13 via contacts 16 and 17, respectively. The other end of the backing-purpose metal wiring lines 14 and 15 has a corresponding one of contacts 20 and 21, respectively. In a direction perpendicular to the extension of the backing-purpose metal wiring lines 14 and 15, i.e., in a direction parallel to the extension of the gate 11, metal wiring lines 18 and 19 are laid out in a second wiring layer. The second wiring layer is provided above the first wiring layer. The metal wiring lines 18 and 19 in the second wiring layer are connected to the backing-purpose metal wiring lines 14 and 15, respectively, via the contacts 20 and 21. Here, the term "contact" refers to a connection member which connects between different wiring layers via a contact hole or a contact layer.

As previously described, wiring lines crossing each other need to be provided in different wiring layers. In the present invention, all wiring lines extending in a direction perpendicular to the extension of the gate 11 are arranged in the first wiring layer, and all wiring lines extending in parallel to the gate 11 are laid out in the second wiring layer.

The layout of FIGS. 5A and 5B achieves a sufficiently large and desirable gate width by using metal wiring lines having a relatively low resistance as a backing for diffusion layers having a relatively high resistance. In the present invention, the backing-purpose metal wiring lines 14 and 15 connected to the diffusion-layer regions 12 and 13 are provided in the first wiring layer in a direction perpendicular to the extension of the gate 11. Because of this, the layout of FIG. 5A allows wiring lines such as traversing wiring lines (not shown) running in parallel to the gate 11 to be laid out in the second wiring layer over an area of the circuit device. A need for laying out traversing wiring lines or the like to bypass the portion of the circuit device is thus eliminated, thereby allowing an substantially unrestricted layout of the wiring lines.

Figure 1A:
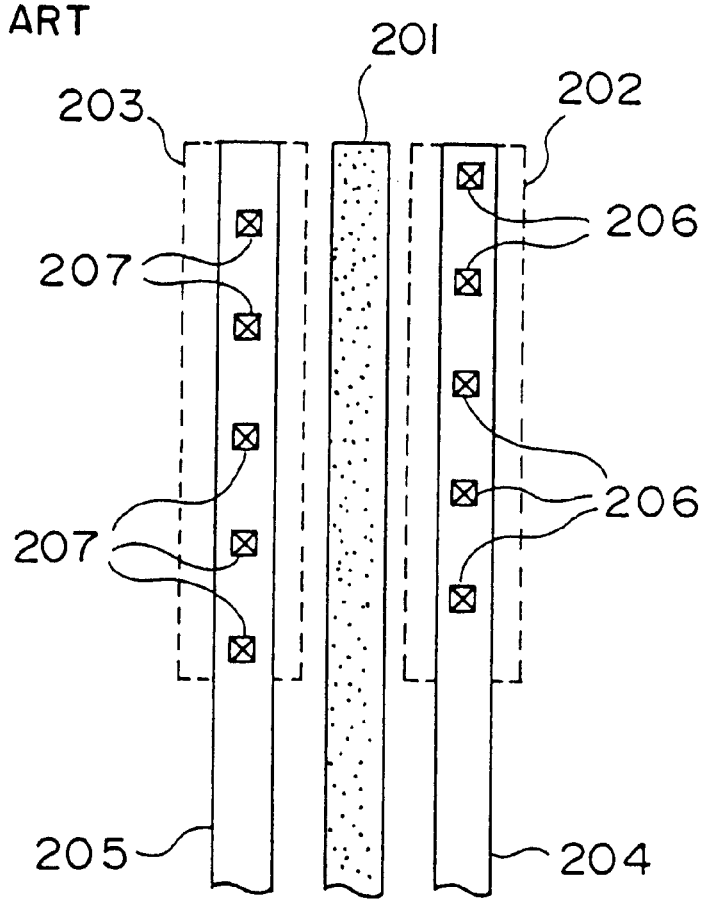
FIGS. 1A and 1B are illustrative drawings showing a related-art backing of source-and-drain regions through metal wiring lines.
Figure 1B:
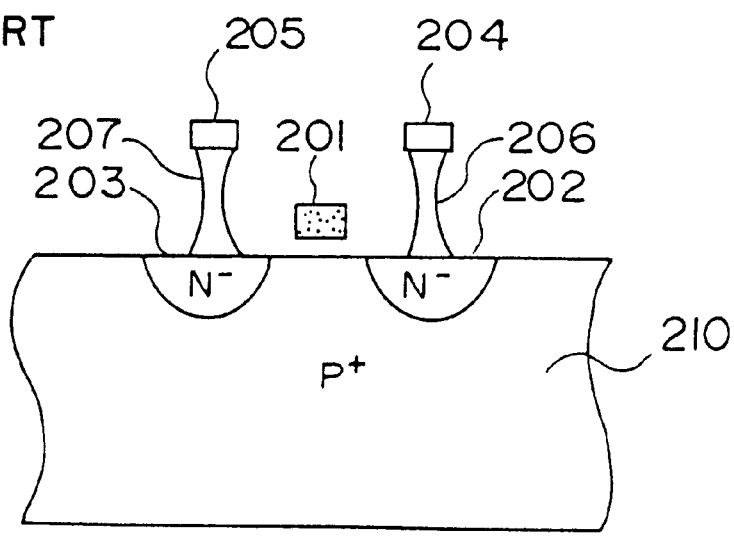

In the related-art layout of FIG. 1A, wiring lines extending in parallel to the gate 201 in the first wiring layer cannot be arranged over the portion of the circuit device. In the related-art layout, however, wiring lines extending perpendicularly to the gate 201 in the second wiring layer can run across the portion of the circuit device. On the other hand, the layout of the present invention shown in FIGS. 5A and 5B allows wiring lines extending in parallel to the gate 11 in the second wiring layer to run across the portion of the circuit device, but appears not to allow wiring lines laying perpendicularly to the gate 11 in the first wiring layer to extend over the portion of the circuit device.

Contrary to this appearance, intervals of the contacts 16 and 17 for providing a backing for the diffusion-layer regions 12 and 13 can be made relatively wide as long as there is no need to be too sensitive about the low resistance of the diffusion-layer regions 12 and 13. In the layout of FIG. 5A, for example, only every other one of the contacts 16 and 17 may be provided so as to double the intervals of the provided contacts 16 and 17 and, thus, double the intervals of the backing-purpose metal wiring lines 14 and 15. If gaps between the contacts 16 and 17 are widened in this manner, wiring lines extending perpendicularly to the gate 11 in the first wiring layer can run across the portion of the circuit device.

In the related-art layout of FIG. 1A, however, if wiring lines running in parallel to the gate 201 in the first wiring layer is to be laid out over the portion of the circuit device, a new space needs to be created by widening an interval between the backing-purpose metal wiring lines. This results in an elongated gate length. Because of this, wiring lines in the first wiring layer cannot be laid out over the portion of the circuit device in practice. Otherwise, characteristics of the circuit device deviate from desired characteristics.

As described above, the backing layout of the present invention not only allows wiring lines extending in parallel to the gate 11 in the second layer to run across the portion of the circuit device, but also allows wiring lines extending perpendicularly to the gate 11 in the first wiring layer to be laid out over the portion of the circuit device by adjusting intervals of the contacts. Therefore, there is no need to make traversing wiring lines or the like bypass the portion of the circuit device, thereby achieving a high degree of latitude in the layout of wiring lines.

In what follows, embodiments of the present invention will be described with reference to the accompanying drawings.

Figure 2:
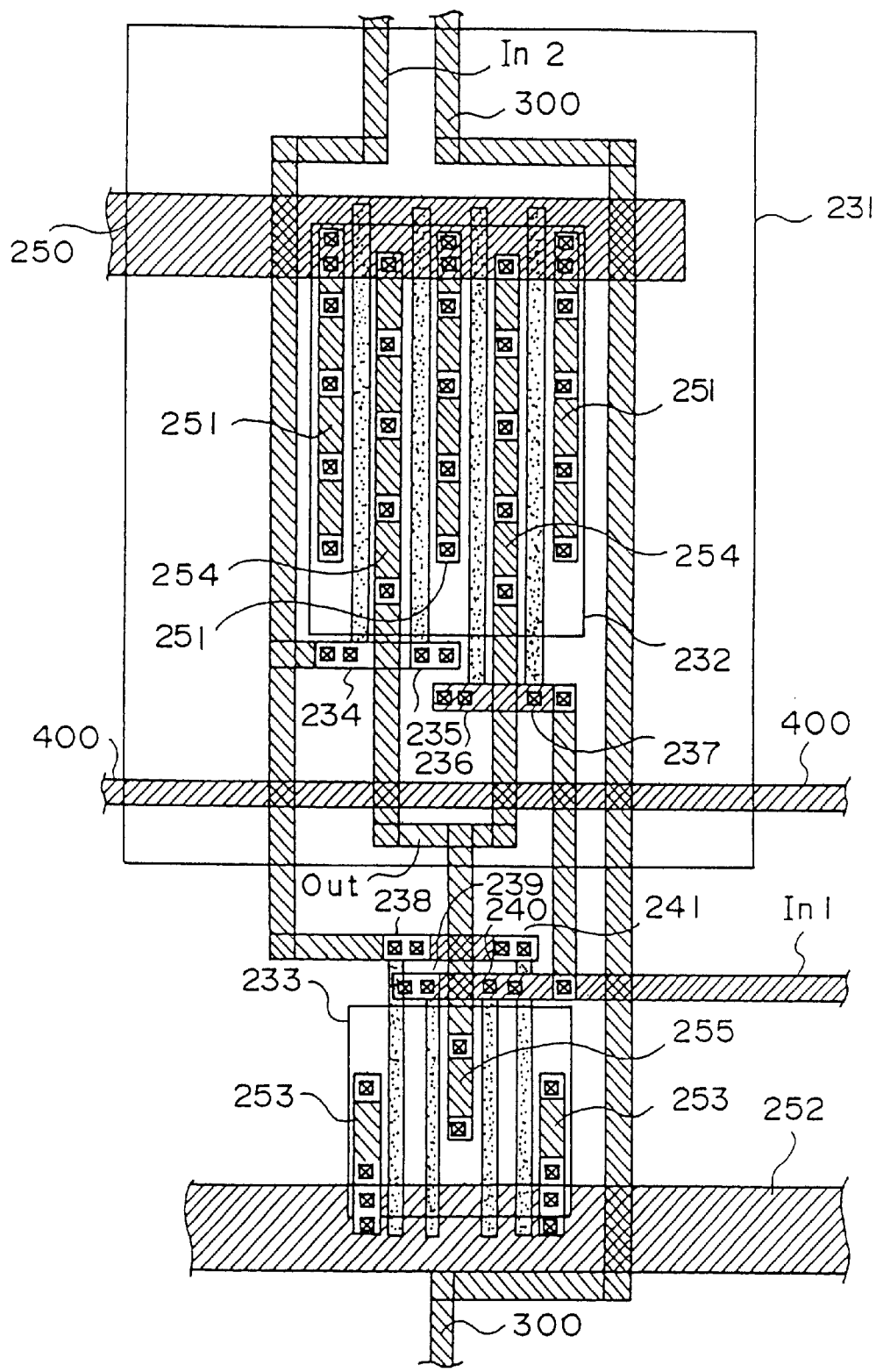
FIG. 2 is an illustrative drawing showing an example of a related-art layout in which a NAND circuit is implemented as a semiconductor device.
Figure 3:
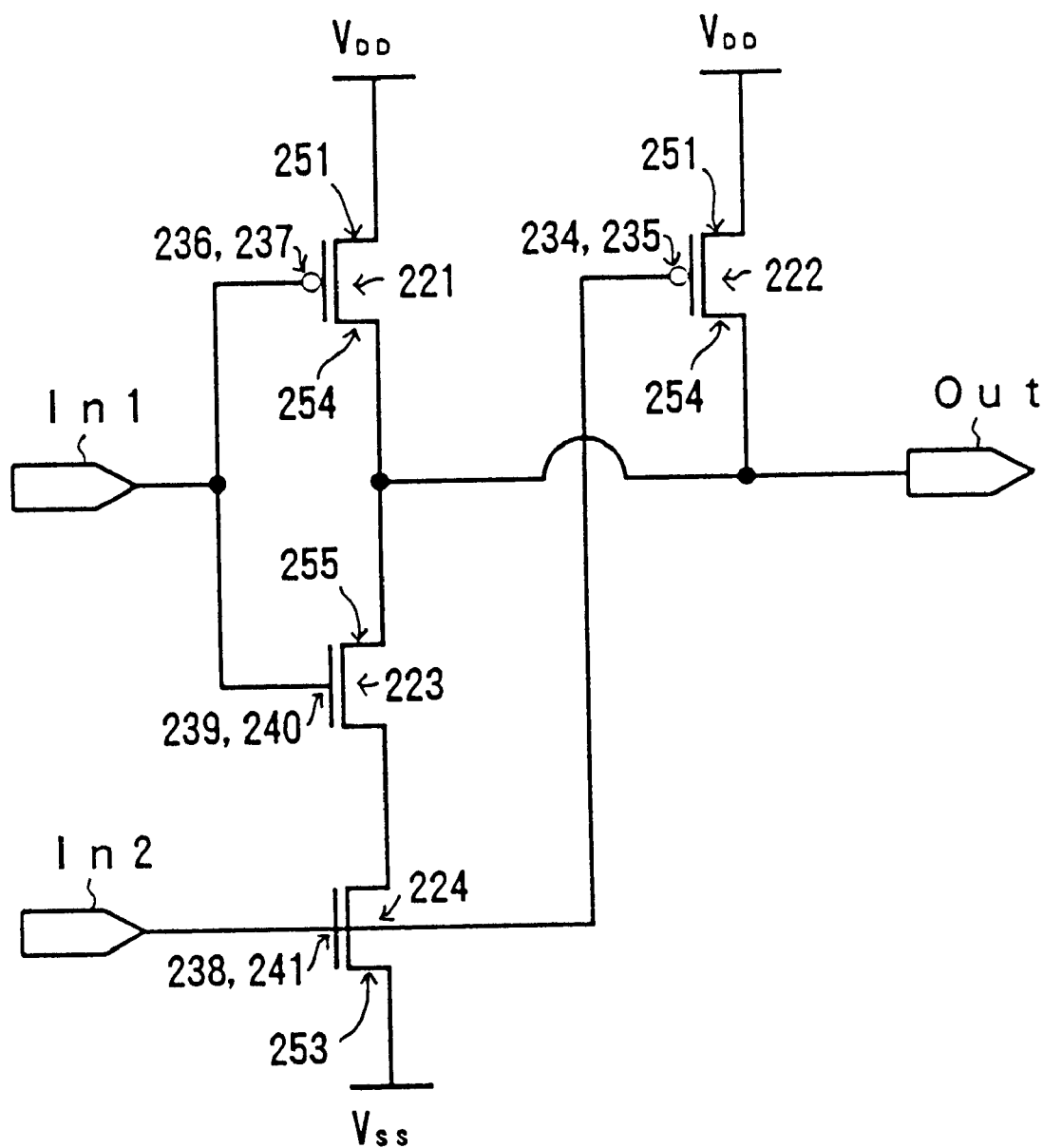
FIG. 3 is a circuit diagram of the NAND circuit of FIG. 2.
Figure 4:
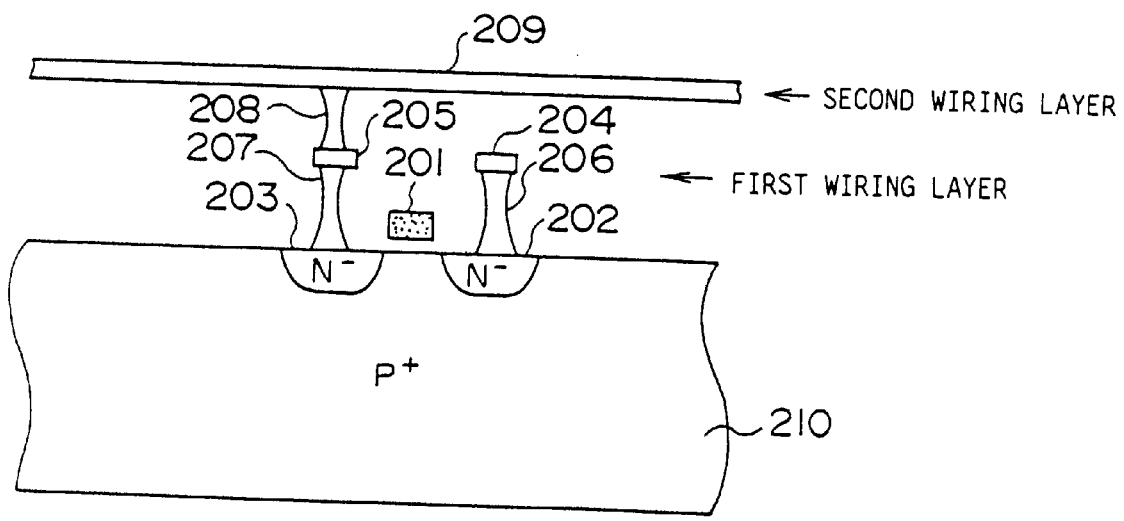
FIG. 4 is an illustrative drawing showing wiring layers used in the related art.
Figure 6:
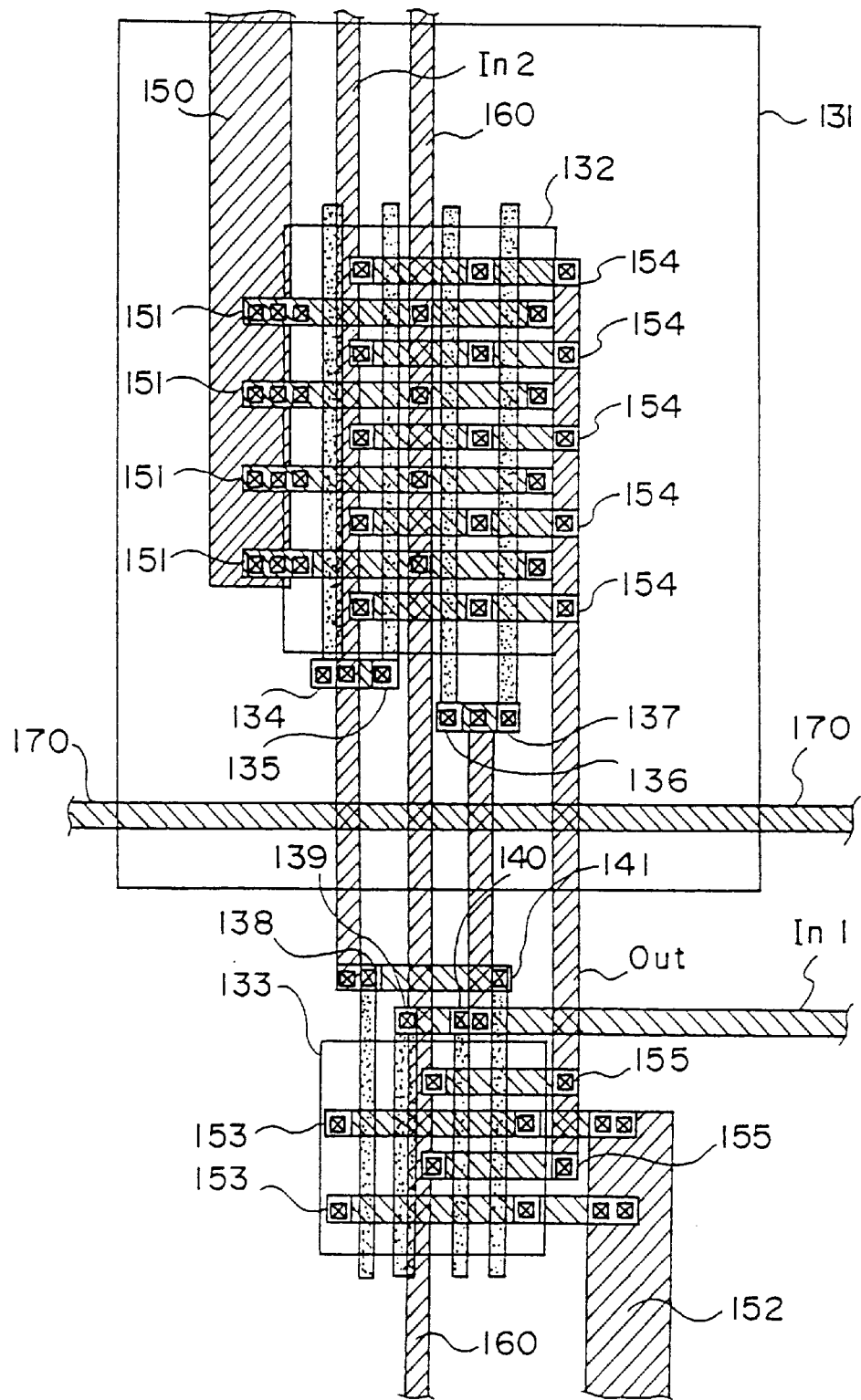
FIG. 6 is an illustrative drawing showing an example of a layout in which a two-input NAND circuit similar to that of FIG. 2 is implemented according to the backing layout of the present invention.
Figure 7:
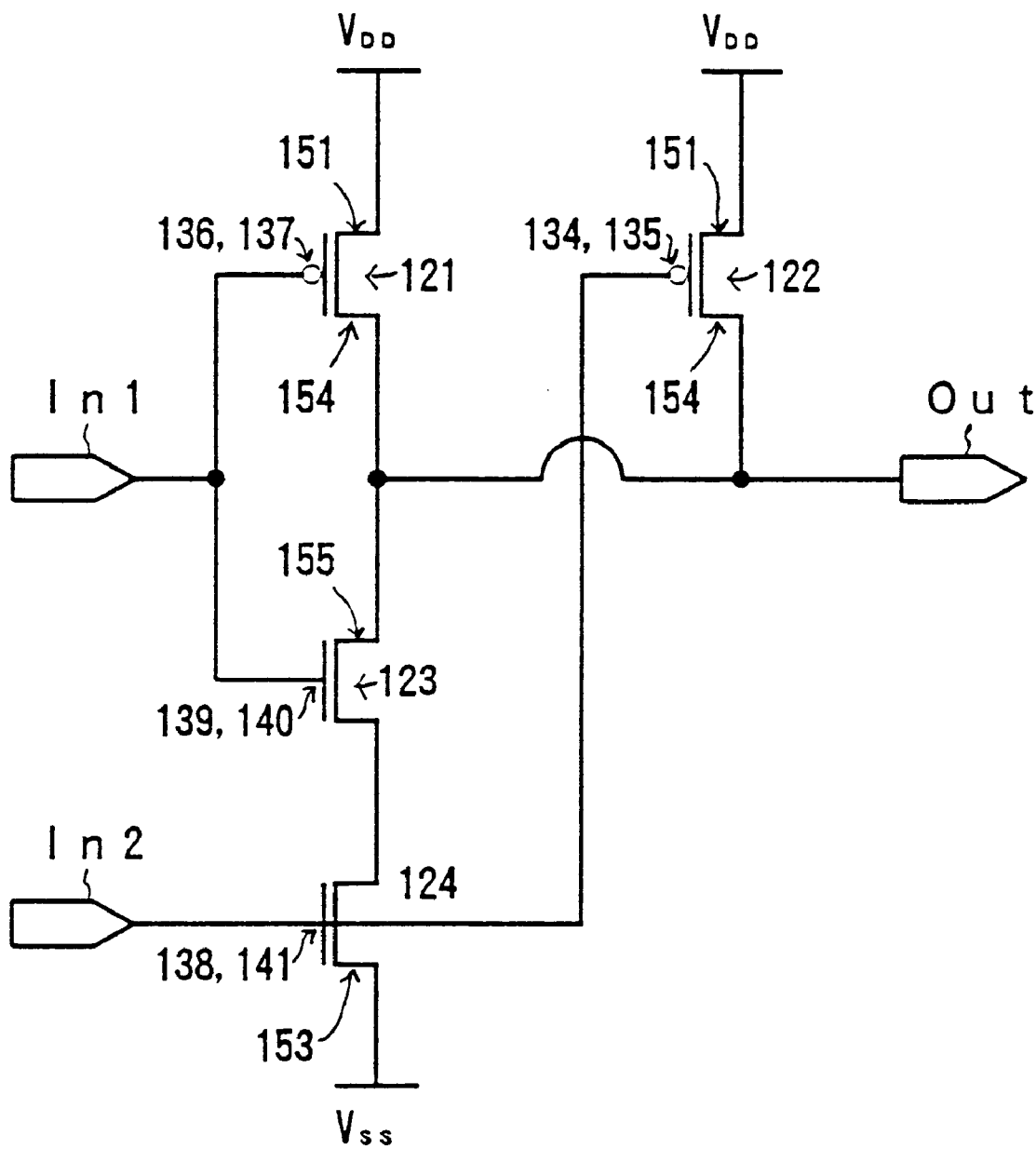
FIG. 7 is a circuit diagram of the NAND circuit of FIG. 6.

FIG. 6 is an illustrative drawing showing an example of a layout in which a two-input NAND circuit similar to that of FIG. 2 is implemented according to the backing layout of the present invention. FIG. 7 is a circuit diagram of the NAND circuit of FIG. 6. In FIG. 6 and FIG. 7, the same elements are referred to by the same numerals.

In FIG. 6, an Nwell 131 is formed in a P-type substrate, and a C-MOS transistor is created by using a P-type diffusion-layer region 132, an N-type diffusion-layer region 133, and polysilicon gates 134 through 141. A correspondence between the polysilicon gates 134 through 141 and the transistors 121 through 124 is shown in FIG. 7 where the gates 134 through 141 are indicated.

An input In1 is connected to the gates 136 and 137 as well as to the gates 139 and 140. An input In2 is connected to the gates 134 and 135 and to the gates 138 and 141. A ground wiring line 152 is connected to wiring lines 153 which correspond to a source of the NMOS transistor 124. A power wiring line 150 is connected to wiring lines 151 which correspond to sources of the PMOS transistors 121 and 122. An output Out is connected to wiring lines 154 corresponding to drains of the PMOS transistors 121 and 122, and, also, is connected to a wiring line 155 which corresponds to a drain of the NMOS transistor 123.

In an example of FIG. 6, the wiring lines 151, 153, 154, and 155 are used for backings, and are provided in a first wiring layer above the P-type substrate. On the other hand, the power wiring line 150, the ground wiring line 152, the input wiring line In1, and a traversing wiring line 160 are arranged in a second wiring layer provided over the first wiring layer.

In the layout of FIG. 6, the input wiring line In2 and the traversing wiring line 160 are arranged to run across a portion of a circuit device which is comprised of the PMOS transistors 121 and 122 (FIG. 7) formed in the diffusion-layer region 132. In this manner, the layout of FIG. 6 offers greater latitude in arranging wiring lines which run in parallel to the extension of the gate, compared to the related-art layout of FIG. 2. In other words, the layout of FIG. 6 can achieve an arrangement of wiring lines which minimizes wiring-line resistances and capacitances as much as possible. Further, the input wiring line In2 and the traversing wiring line 160 can be laid out without getting around the portion of the circuit device, so that a total area size required for laying out all the wiring lines is smaller than that of the layout of FIG. 2 by an area size corresponding to the widths of the input wiring line In2 and the traversing wiring line 160. layer in order to implement a required layout.

In this manner, the backing layout of the present invention allows wiring lines to run across a portion of a circuit device not only when the wiring lines extend in parallel to the gates but also when the wiring lines extend perpendicularly to the gates. However, no pressing demand generally exists to arrange wiring lines over the portion of the circuit device when the wiring lines extend perpendicularly to the gates. When forming a C-MOS transistor as shown in FIG. 6, the Nwell 131 must be positioned at some distance from an area where an N-type transistor is formed in order to ensure proper semiconductor characteristics. Because of this relatively long distance between a P-type transistor and an N-type transistor, the configuration of the C-MOS transistor of FIG. 6 has a sufficient space for accommodating wiring lines extending perpendicularly to the gates (i.e., wiring lines extending in a horizontal direction of the figure), so that there is no need to place the traversing wiring line 170 or the like over the portion of the circuit device.

Figure 8:
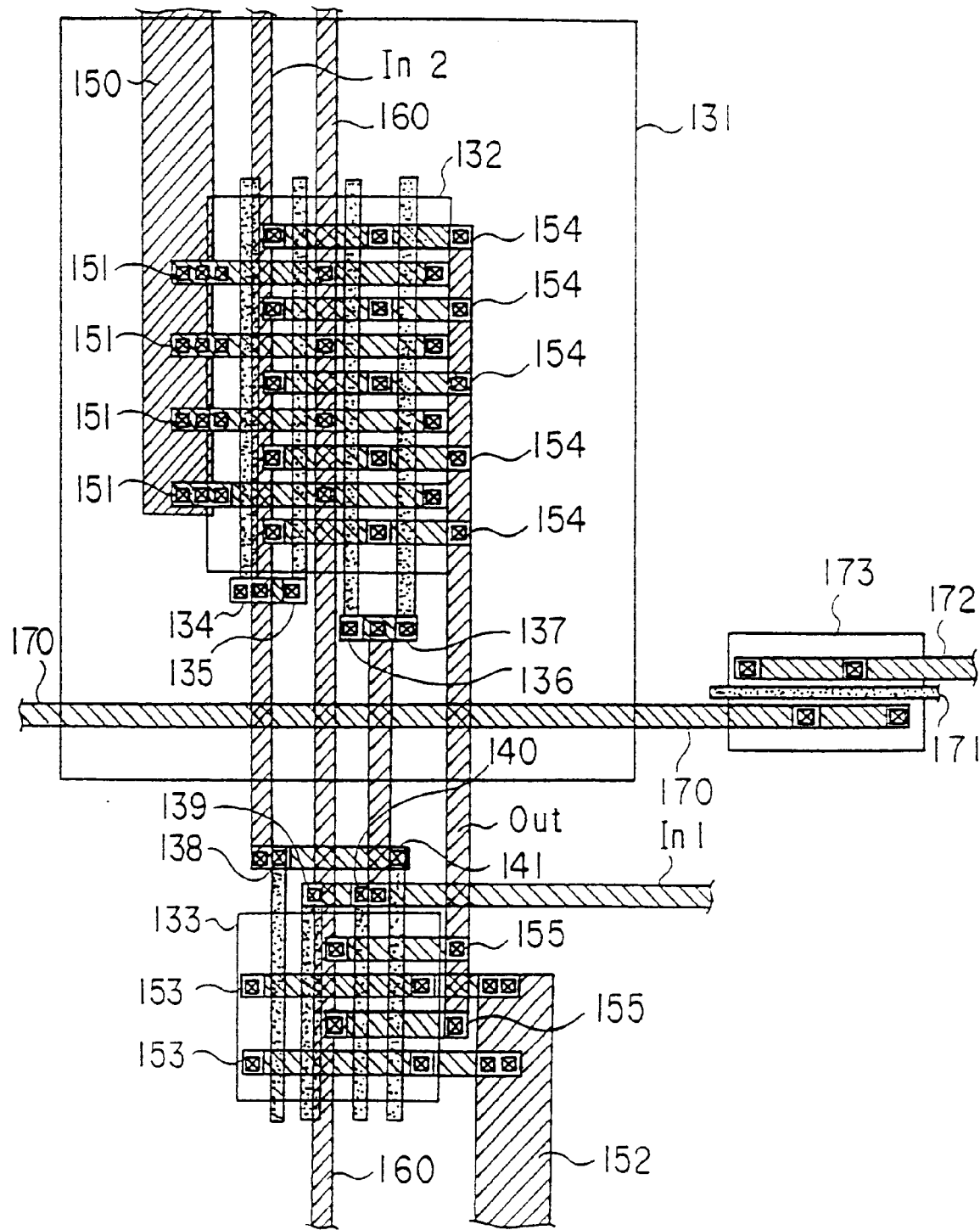
FIG. 8 is an illustrative drawing showing a variation of the embodiment of FIG. 6.

FIG. 8 is an illustrative drawing showing a variation of the embodiment of FIG. 6. In FIG. 8, the same elements as those of FIG. 6 are referred to by the same numerals, and a description thereof will be omitted.

FIG. 8 is provided as an example to show that the backing layout of the present invention can be used with the backing layout of the related art on the same substrate. Assume that there is a need in the layout of FIG. 6 to provide a transistor having a gate extending in a horizontal direction of the figure at a position somewhere along an extension of the traversing wiring line 170 on the right-hand side of the figure. FIG. 8 shows a configuration which satisfies this need. As shown in FIG. 8, a gate 171 made of polysilicon and a backing-purpose metal wiring line 172 are provided on a N-type diffusion-layer region 173 in accordance with the layout of the related art, and the N-type transistor thus created is connected to the traversing wiring line 170. FIG. 8 is provided only to show that the backing layout of the present invention can be used along with the layout of the related art on the same substrate, and details of a layout are omitted. Because of this, FIG. 8 shows no wiring line connected to the gate 171.

As shown in FIG. 8, the layout of the present invention uses the first wiring layer to arrange wiring lines such as the traversing wiring line 170 extending in the horizontal direction of the figure, and uses the second wiring layer for accommodating wiring lines such as the traversing wiring line 160 extending in a vertical direction of the figure. When a circuit device such as a transistor which has a gate extending in the horizontal direction needs to be connected to a wiring line such as the traversing wiring line 170 extending in the same direction, it is preferable to use the backing layout of the related art rather than the backing layout of the present invention. This is because use of the related-art backing layout in such a case makes it possible to arrange the wiring lines without undermining a basic principle that the wiring lines extending in the horizontal direction are provided in the first layer and the wiring lines running in the vertical direction are formed in the second layer. When this basic principle is observed, a layout of all the wiring lines as a whole can be efficiently made.

This becomes apparent when a third wiring layer is provided over the second wiring layer.

Figure 9:
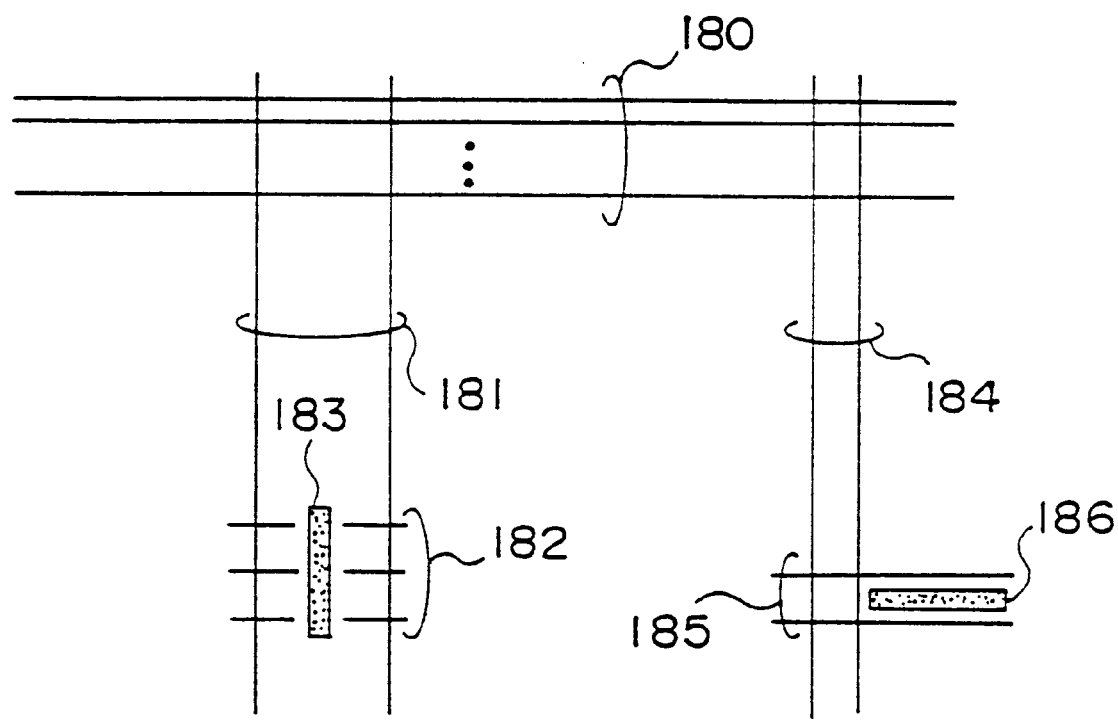
FIG. 9 is an illustrative drawing showing a layout of each layer when first through third layers are provided.

FIG. 9 is an illustrative drawing showing a layout of each layer when the first through third layers are provided.

A backing layout of the present invention is applied to a gate 183, so that wiring lines 182 extending in a horizontal direction are provided in a first wiring layer, and wiring lines 181 running in a vertical direction are arranged in a second wiring layer. When wiring lines 180 extending in the horizontal direction are provided in a third wiring layer, it is easy to connect the wiring lines 180 in the third wiring layer to the backing layout used for the gate 183. When there is a need to form a circuit device having a gate extending in the horizontal direction such as a gate 186, wiring lines 185 in the first wiring layer are preferably arranged to extend in the horizontal direction because the wiring lines 185 need to be connected to the wiring lines 180 in the third wiring layer via wiring lines 184 in the second wiring layer. That is, the backing-purpose metal wiring lines 185 in the first wiring layer preferably extend in parallel to the gate 186. In this manner, an efficient layout of wiring lines is achieved by combining the layout of the present invention and the layout of the related art.

Further, the present invention is not limited to these embodiments, but various variations and modifications may be made without departing from the scope of the present invention.

What is claimed is:

1. A semiconductor integrated circuit comprising:

a gate of a transistor, said gate extending in a first direction;

a diffusion-layer region defining one of a source region and a drain region of the transistor;

a plurality of backing wiring lines commonly connected to said diffusion-layer region and extending in a first wiring layer and in a second direction substantially perpendicular to said first direction; and connection wiring lines providing connections between said plurality of backing wiring lines and provided in a second wiring layer.

2. The semiconductor integrated circuit as claimed in claim 1, wherein said diffusion-layer region includes a first diffusion-layer region corresponding to a source and a second diffusion-layer region corresponding to a drain, said plurality of backing wiring lines including a plurality of first backing wiring lines connected to said first diffusion-layer region and a plurality of second backing wiring lines connected to said second diffusion-layer region, said connection wiring lines including a first connection wiring line for providing connections between said plurality of first backing wiring lines and a second connection line for providing connections between said plurality of second backing wiring lines.

3. The semiconductor integrated circuit as claimed in claim 1, wherein each of said plurality of backing wiring lines is connected to said diffusion-layer region via at least a corresponding one of a plurality of contacts which are arranged along said first direction.

4. The semiconductor integrated circuit as claimed in claim 1, further comprising:

first wiring lines provided in said first wiring layer; and second wiring lines provided in said second wiring layer, wherein said first wiring lines extend in said second direction and said second wiring lines extend in said first direction.

5. The semiconductor integrated circuit as claimed in claim 4, wherein at least one of said second wiring lines runs across an area over said diffusion-layer region.

6. The semiconductor integrated circuit as claimed in claim 4, wherein at least one of said first wiring lines runs across an area over said diffusion-layer region by passing through said plurality of backing wiring lines.

7. The semiconductor integrated circuit as claimed in claim 4, further comprising:

another gate extending in said second direction;

a third diffusion-layer region corresponding to said another gate;

a plurality of other backing wiring lines having connections to said third diffusion-layer region and extending in said first wiring layer in said second direction.

8. A semiconductor device comprising:

a gate of a transistor;

a plurality of backing-purpose wiring lines extending in a direction substantially perpendicular to an extension of said gate, said backing-purpose wiring lines commonly connected to a single region that is one of a drain region and a source region of the transistor; and connection wiring lines providing connections between said plurality of backing-purpose wiring lines.

9. The semiconductor device as claimed in claim 8, wherein said plurality of backing-purpose wiring lines are provided in a first wiring layer, and said connection wiring lines are provided in a second wiring layer.

10. The semiconductor device as claimed in claim 9, wherein said first wiring layer is used for accommodating wiring lines extending in a direction substantially perpendicular to an extension of said gate, and said second wiring layer is used for accommodating wiring lines extending in a direction substantially parallel to an extension of said gate.

* * * * *